United States Patent [19]

Ohtsu

[11] Patent Number: 5,148,437
[45] Date of Patent: Sep. 15, 1992

[54] LASER PUMPED ATOMIC FREQUENCY STANDARD WITH HIGH FREQUENCY STABILITY

[75] Inventor: Motoichi Ohtsu, Yamato, Japan

[73] Assignee: Anritsu Corporation, Tokyo, Japan

[21] Appl. No.: 754,268

[22] Filed: Aug. 29, 1991

Related U.S. Application Data

[63] Continuation of Ser. No. 570,296, Aug. 20, 1990.

[30] Foreign Application Priority Data

Aug. 21, 1989 [JP] Japan .................................. 1-214700

[51] Int. Cl.$^5$ ................................................ H01S 3/13
[52] U.S. Cl. ........................................ 372/32; 372/38; 333/3; 333/94.1
[58] Field of Search ............................ 372/32, 38, 29; 331/94.1, 3

[56] References Cited

U.S. PATENT DOCUMENTS

| | | | |
|---|---|---|---|
| 4,316,153 | 2/1982 | Busca et al. | 331/94.1 |
| 4,740,761 | 4/1988 | Barnes et al. | 331/94.1 |
| 4,918,700 | 4/1990 | Gambini | 372/32 |

OTHER PUBLICATIONS

Article entitled "Ultra-Sensitive Frequency Discrimination in a Diode Laser Pumped $^{87}$Rb Atomic Clock" by M. Hashimoto, et al. presented at the 41st Annual Frequency Control Symposium, Jun. 1987, Philadelphia, Pa., Session B3, Paper number 3 pp. 74–84.
Modulation Transfer and Optical Stark Effect in a Rubidium Atomic Clock Pumped by a Semiconductor Laser, J. Opt. Soc. Am. B/vol. 6, No. 10/Oct. 1989; pp. 1777–1789.
Experiments on a Semiconductor Laser Pumped Rubidium Atomic Clock, M. Hashimoto & M. Ohtsu; 1987 IEEE; vol. QE-23, No. 4, Apr. 1987; pp. 446–451.
IEEE Transactions on Instrumentation and Measurement, vol. 39, No. 3, Jun. 1990, pp. 458–462.
IEEE Journal of Quantum Electronics, vol. QE-21, No. 12, Dec. 1985, pp. 1905–1912.

Primary Examiner—Georgia Y. Epps
Attorney, Agent, or Firm—Frishauf, Holtz, Goodman & Woodward

[57] ABSTRACT

A laser emits a laser beam with a predetermined frequency, serving as pumping light, to a double resonance section. A VCO oscillates a predetermined frequency signal that is the origin of a microwave. An oscillator oscillates a modulation signal and a low frequency signal to be a reference signal for a sync detection. A synthesizer generates a microwave acquired by subjecting the predetermined frequency signal to multiplication and phase modulation in accordance with the predetermined frequency signal and the modulation signal, and applies the microwave to the double resonance section. A photosensor detects a component of the laser beam modulated by the double resonance section. A PSD detects the level and phase of an output signal of the photosensor with the reference signal. A sweep signal generator generates a sweep signal for the microwave. A switch has first and second nodes to be mutually switched from one to the other, and feeds a PSD output back to the VCO when switched to the first node, and supplies the sweep signal to the VCO to permit sweeping of the frequency of the microwave when switched to the second node. An integration processor detects the amount of shift of a microwave resonance frequency according to the PSD output and feeds a laser frequency compensation signal back to the laser, in a state where the switch is set to the second node.

18 Claims, 13 Drawing Sheets

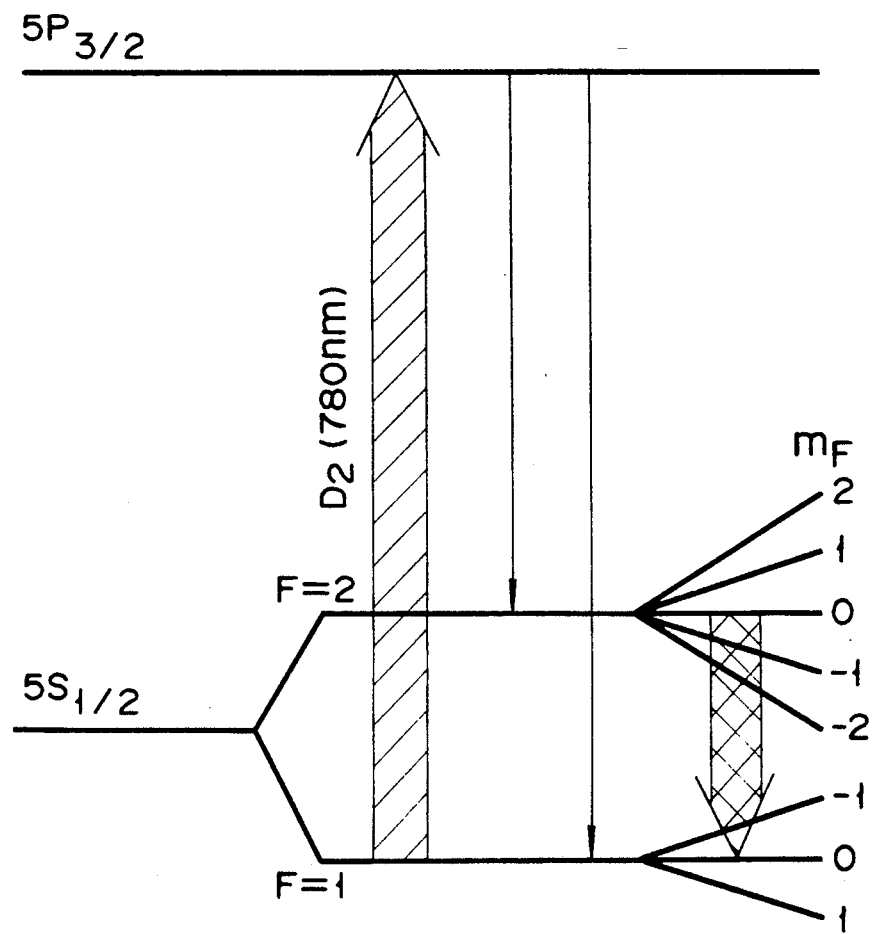
F I G. 4

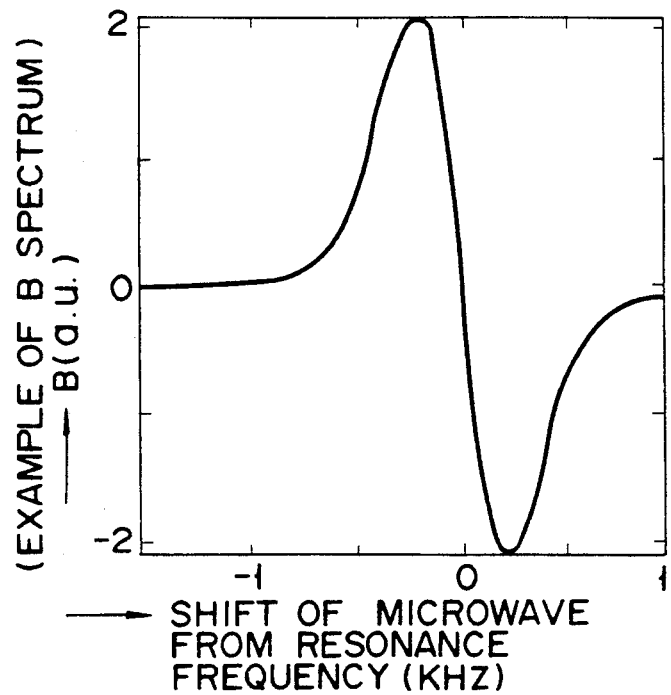
F I G. 5A
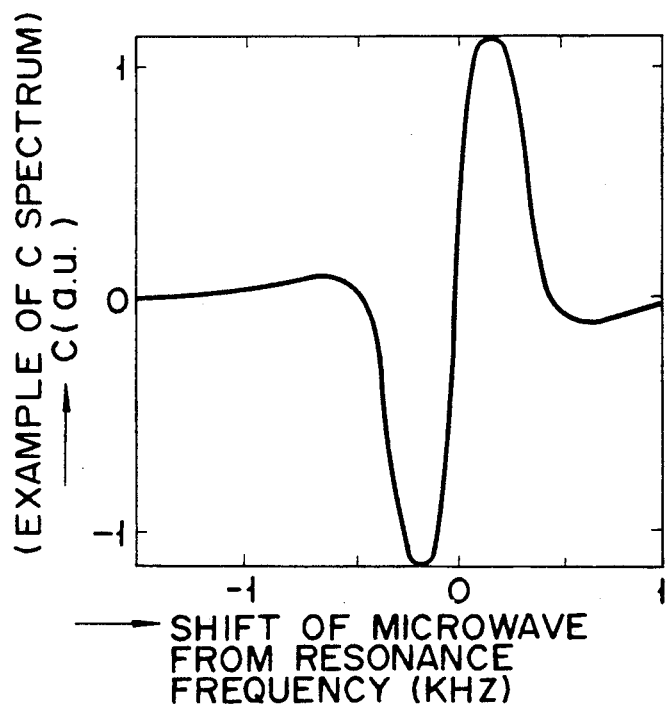
F I G. 5B

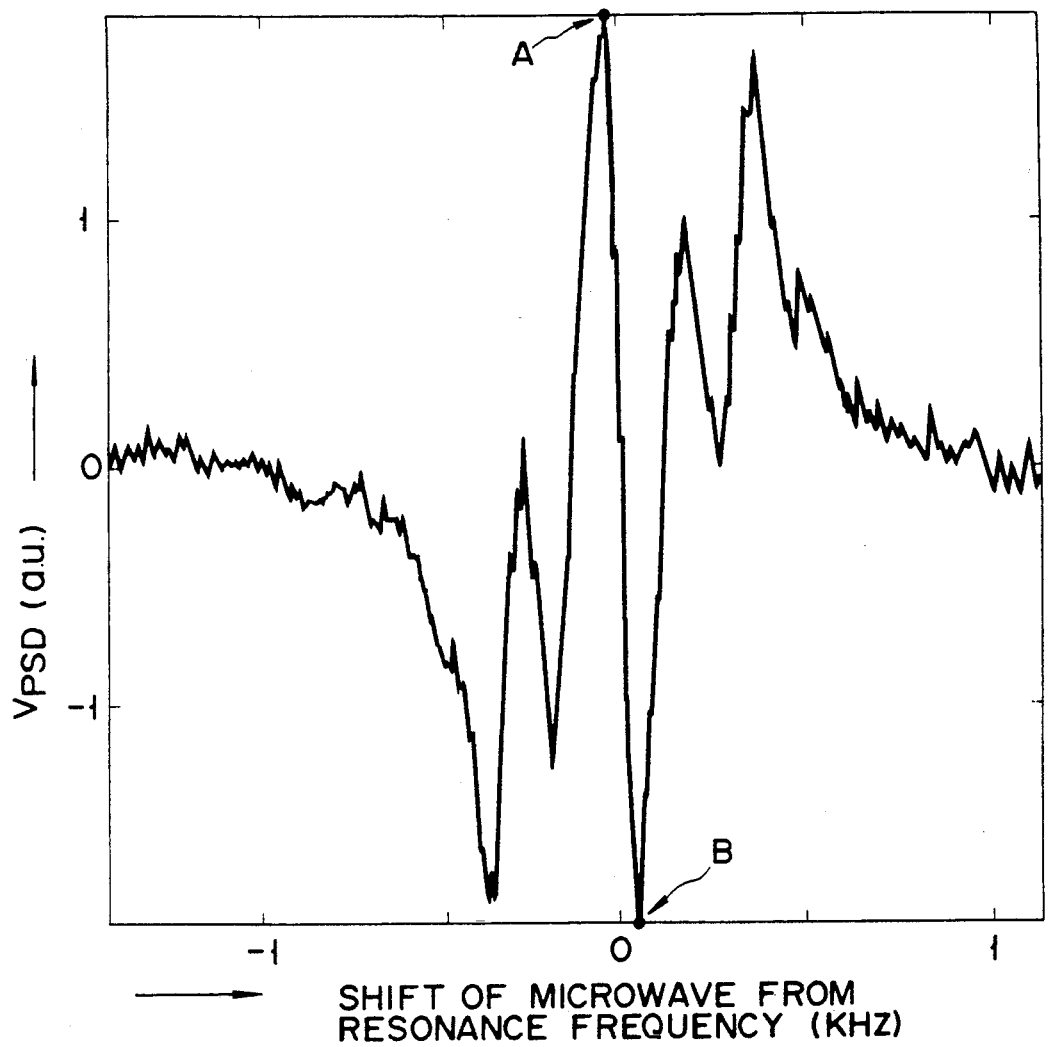
F I G. 6

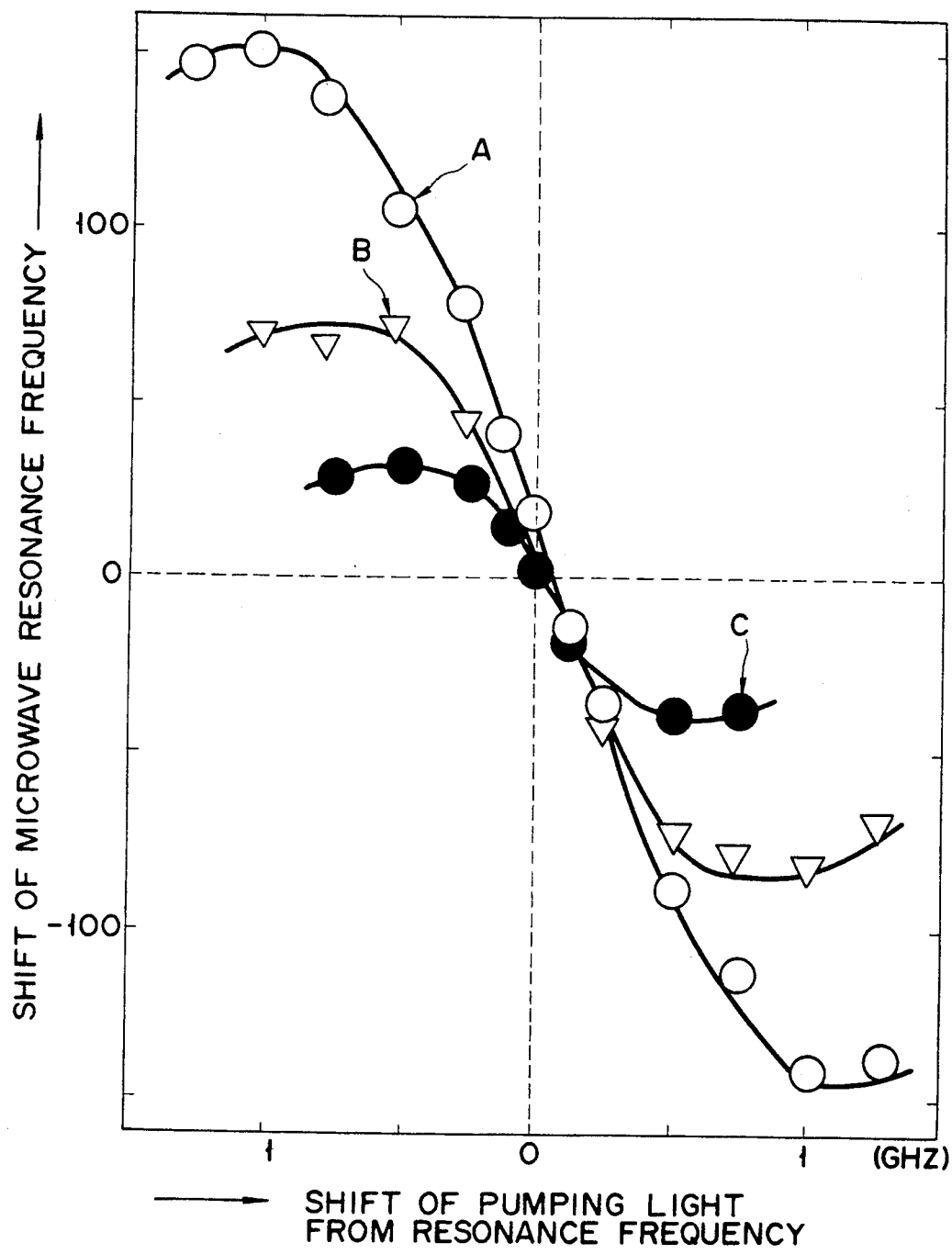
F I G. 7

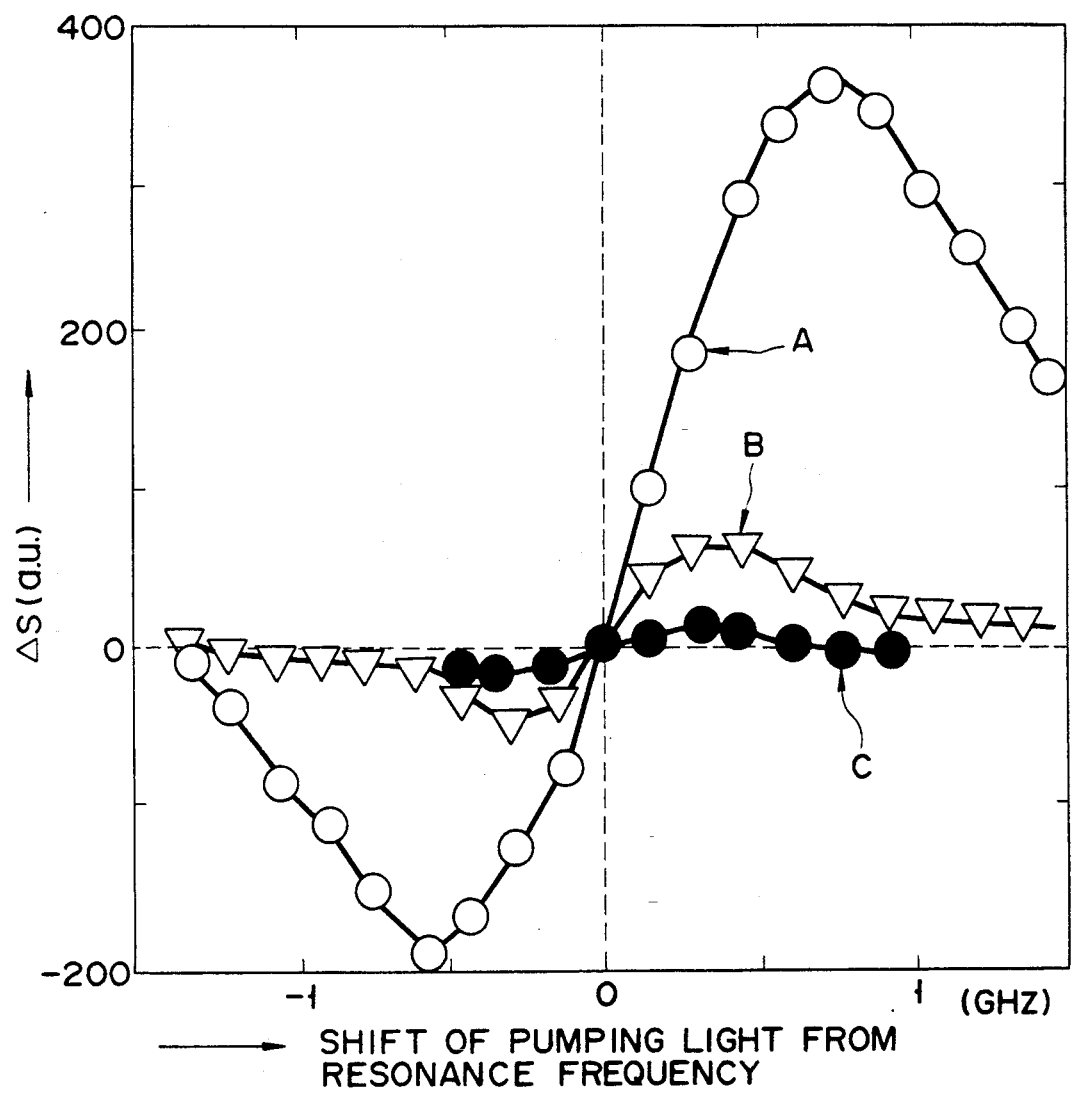
F I G. 10

LASER PUMPED ATOMIC FREQUENCY STANDARD WITH HIGH FREQUENCY STABILITY

This application is a continuation of application Ser. No. 07/570,296, filed Aug. 20, 1990.

BACKGROUND OF THE INVENTION

1. Field of the Invention

The present invention relates to an atomic frequency standard and, more particularly, to a rubidium- or cesium-using atomic frequency standard, which frequency standard utilizes a laser-pumped optical-microwave double resonance.

2. Description of the Related Art

Today, a rubidium ($^{87}$Rb) or cesium ($^{133}$Cs) atomic frequency standard is used as a small, practical high-performance secondary frequency standard in multifarious fields, such as communications, broadcasting, navigation and GPS (Global Positioning System) satellites.

The present inventor and some other have proposed to use a semiconductor laser as a pumping light source of a Rb atomic frequency standard in place of a Rb lamp to improve the performance, and in particular, to effectively use the modulation transfer effect between microwave and laser light to provide short-period frequency stabilization, as disclosed in "Experiments On A Semiconductor Laser Pumped Rb Atomic Clock," by M. Hashimoto and M. Ohtsu, IEEE J. Quantum Electron. QE-23, 446–451 (1987).

This semiconductor laser pumped Rb atomic frequency standard will be briefly described referring to the block structure shown in FIG. 3.

The atomic resonance section of the frequency standard comprises a semiconductor laser 1, a resonance cell 2 having Rb gas and buffer gas sealed in a gas cell, and a microwave cavity resonator 3 disposed surrounding the whole resonance cell 2. A signal of a predetermined frequency which is the cause of a microwave generated from a voltage-controlled crystal oscillator 5, is multiplied by a given factor in a frequency synthesizer 6 and is subjected to phase modulation by a wave with a modulation angular frequency $\omega_m$ from a modulation oscillator 7. The resultant signal (e.g., 6.83 GHz in case of Rb) is applied to the microwave cavity resonator 3. Light coming from the semiconductor laser 1 led via an attenuator 1a to the resonance cell 2. Thereby, the light frequency is modulated by the modulation transfer and is absorbed by an optical-microwave double resonance. The light transmitted from the resonance cell is subjected to photoelectric conversion by a photosensor 4.

A signal from the photosensor 4 is supplied via an amplifier A to a phase sensitive detector (PSD) 8 where it is subjected to PSD using a reference signal of a modulation angular frequency $\omega_m$ from the modulation oscillator 7. The output of the PSD 8 is supplied via a low-pass filter (LPF) 9 to the voltage-controlled crystal oscillator (VCXO) 5.

Reference numeral "10" denotes a current source for driving the laser 1.

FIG. 4 illustrates the energy level of an $^{87}$Rb atom. In this diagram, a model of the $^{87}$Rb-D$_2$ line is illustrated by a 3-level atomic system for simplicity.

A Rb atomic oscillator shown in FIG. 3 is an automatic control system, which stabilizes the output frequency of the voltage-controlled crystal oscillator 5 based on the microwave resonance between the hyperfine levels of the $^{87}$Rb atom in the ground state.

An optical-microwave double resonance method is used as a technique to detect the microwave resonance. The optical-microwave double resonance is caused by providing a population difference between the hyperfine levels in the ground state in FIG. 4 presenting the energy level illustration of the $^{87}$Rb atom by means of laser pumping, and causing the interaction between the atoms and the microwave obtained by multiply the reference frequency of the microwave from the voltage-controlled crystal oscillator 5 by a given factor.

That is to say, referring to FIG. 4, the ground state 5S is divided into two hyperfine levels: F=1 and F=2. Upon absorption of the light from the semiconductor laser 1, $^{87}$Rb is pumped to the excited level, 5P, from the level of F=1, and is transited to the levels of F=1 and F=2 with an equal probability. $^{87}$Rb transited to the level of F=1 is pumped again to the excited level 5P by the light from the laser 1. In this manner, $^{87}$Rb at the level of F=1 gradually decreases, thus reducing the amount of light absorbed by the resonance cell 2. Under this situation, when an electromagnetic wave of approximately 6.8 GHz, which corresponds to the energy difference between F=1 and F=2, is applied to the cavity resonator 3, $^{87}$Rb at the level of F=2 transits to F=1 by the stimulated emission, and absorption by the resonance cell 2 is again increased. The light passing the resonance cell 2 is detected by the photosensor 4 and the voltage-controlled crystal oscillator 5 is controlled in such a manner as to minimize the amount of this transmitted light or maximize the absorbed light. Since the output frequency of the oscillator 5 is determined by the hyperfine levels of $^{87}$Rb, it is well stabilized. For instance, with the multiplication factor of the frequency synthesizer 6 being about 1360, a frequency of 5 MHz would be acquired.

Although the intensity of the pumping laser beam passing the gas cell 2 having $^{87}$Rb sealed therein is detected by the photosensor 4, a very slight absorption spectrum is acquired by occurrence of the optical-microwave double resonance. This transmission light signal is amplified by the amplifier A, then supplied to the PSD 8 where it is subjected to PSD by the modulation wave having the modulation angular frequency $\omega_m$ which is applied to the microwave. The resultant PSD output $V_{PSD}$ is used as an signal which is fed back via the low-pass filter 9 to the voltage-controlled crystal oscillator 5.

In analyzing under the modulation transfer between microwave and light, the PSD output $V_{PSD}$ is obtained as a signal similar to the FM side band spectrum. With the reference signal for PSD being $\cos(\omega_m t - \theta)$, the PSD output $V_{PSD}$ is expressed as follows:

$$V_{PSD} = V_0[(B/2)\cos\theta + (C/2)\sin\theta] \tag{1}$$

In the equation, B and C are given by $$B = 2[J_2 J_3(\delta_{-3} + \delta_{-2} - \delta_2 + \delta_3) + \\ J_1 J_2(\delta_{-2} + \delta_{-1} - \delta_1 + \delta_2) + \\ J_0 J_1(\delta_{-1} - \delta_1) \tag{2}$$

-continued
$$C = 2[J_2J_3(\phi_{-3} - \phi_{-2} - \phi_2 + \phi_3) + \\ J_1J_2(\phi_{-2} - \phi_{-1} - \phi_1 + \phi_2) + \\ J_0J_1(\phi_{-1} - 2\phi_0 - \phi_1)] \quad (3)$$

where $V_0$ is a proportional constant, $J_q$ is a Bessel function of the q-th order, $\delta$ and $\phi$ are respectively the amount of amplitude attenuation and the amount of phase shift, which the electric field of light passing the gas cell 2 experience, and the subscription "q" (q=±1, ±2, ±3), indicated that $\delta$ and $\phi$ are shifted by $q\omega_m$ from the microwave resonance angular frequency $\omega_M$.

FIG. 5 shows the dependences of B and C spectrums on the microwave frequency in the equations 2 and 3.

From these diagrams, it should be understood that the B and C spectrums are both odd functions having zero at the center of the microwave resonance frequency.

Therefore, the PSD output $V_{PSD}$ is also an odd function as exemplified in FIG. 6, in accordance with the equation 1, and likewise takes zero at the center of the microwave resonance frequency. Accordingly, the output frequency of this atomic frequency standard can be fixed to the zero-crossing point (between A and B in FIG. 6) by feeding the PSD output $V_{PSD}$ back to the voltage-controlled crystal oscillator 5 via the low-pass filter 9 as shown in FIG. 3.

The above is the principle of stabilizing the frequency of a semiconductor laser pumped Rb atomic frequency standard for a short period of time using a technique of the modulation transfer between microwave and light (hereafter the control technique applied the FM side band spectroscopy) proposed by the present inventor et al. and this apparatus can provide a higher stabilization in the order of about one digit, as compared with the conventional atomic oscillator using a Rb lamp.

Even with the use of such a semiconductor laser pumped Rb atomic frequency standard, the microwave resonance frequency of $^{87}$Rb that is the reference frequency is shifted by an optical Stark effect produced by the electric field of the pumping light (hereafter the light shift) when the frequency of the pumping light varies.

FIG. 7 illustrates this event in which a change occurs in the spectrum shown in FIG. 5.

FIG. 8 also exemplifies deformations of the C spectrum.

In FIG. 7, the curve A is for the laser power density of 1008 μW/cm², the curve B for 360 μW/cm² and the curve C for 144 μW/cm², whereas in FIG. 8, the curve A is for the laser frequency offset of 1200 MHz, the curve B for 0 Hz and the curve C for −1200 MHz.

The light shift hinders the long-period frequency stabilization of the semiconductor laser pumped Rb atomic frequency standard.

The atomic frequency standard utilizing the optical-microwave double resonance pumped by a semiconductor laser still has a shortcoming that the short-period frequency stabilization of the atomic frequency standard is hindered by FM noise of light caused by the semiconductor laser section per se, which cannot be overcome the aforementioned well-known the control technique applied FM side band spectroscopy.

Even if the restriction of the long-period frequency stabilization based on the light shift and the hindrance short-period frequency stabilization originated from FM noise of light generated by the laser section are overcome, collision of the buffer gas and rubidium gas sealed in the gas cell 2 shifts the microwave resonance frequency, thus impairing the accuracy of the output frequency of the voltage-controlled crystal oscillator 5.

The above-described situations also apply to when using $^{133}$Cs substituting $^{87}$Rb.

SUMMARY OF THE INVENTION

It is therefore an object of the present invention to provide a new and improved atomic frequency standard utilizing optical-microwave double resonance method with laser pumping, which standard can eliminate hindrance of the long-period frequency stabilization based on light shift.

It is another object of this invention to provide an atomic frequency standard which can eliminate hindrance of the short-period frequency stabilization due to FM noise of light generated by a laser section as well as the hindrance of the long-period frequency stabilization based on the light shift.

It is a further object of this invention to provide an atomic frequency standard which can eliminate hindrance of the accuracy of the output frequency based on the shift of a microwave resonance frequency by buffer gas as well as the hindrance of the long-period frequency stabilization based on the light shift.

It is a still another object of this invention to provide an atomic frequency standard which can eliminate hindrance of the short-period frequency stabilization due to FM noise of light generated by a laser section and hindrance of the accuracy of the output frequency based on the shift of a microwave resonance frequency by buffer gas in addition to the hindrance of the long-period frequency stabilization based on the light shift.

According to one aspect of the present invention, there is provided an atomic frequency standard comprising:

a double resonance section for causing a double resonance between light and a microwave with respect to a specific atom;

laser means for emitting a laser beam with a predetermined frequency, serving as pumping light, to the double resonance section;

voltage-controlled oscillator means for oscillating a predetermined frequency signal that is the origin of the microwave;

low frequency signal oscillator means for generating a modulation signal and a low frequency signal to be a reference signal;

microwave generator means for generating a microwave acquired by subjecting the predetermined frequency signal to multiplication and at least one of phase and frequency modulation in accordance with the predetermined frequency signal from the voltage-controlled oscillator means and the modulation signal from the low frequency generator means, and applying the microwave to the double resonance section;

photosensor means for detecting a component of the laser beam modulated by the double resonance section;

phase sensitive detector means for detecting a level and a phase of an output signal of the photosensor means with the reference signal from the low frequency signal oscillator means;

sweep signal generator means for generating a sweep signal for sweeping the frequency of the microwave;

switching means, having first and second nodes to be mutually switched from one to the other, for feeding an output signal from the phase sensitive detector means back to the voltage-controlled oscillator means when switched to the first node, and supplying the sweep signal from the sweep signal generator means to the voltage-controlled oscillator means to permit substantial sweeping of the frequency of the microwave emitted from the microwave generator means when switched to the second node; and shift detection/compensation means for substantially detecting an amount of shift of a microwave resonance frequency in the double resonance section in accordance with the output signal from the phase sensitive detector means and feeding a laser frequency compensation signal to cancel out the detected amount of shift back to the laser means, in a state where the switching means is set to the second node.

According to the second aspect of the present invention, there is provided an atomic frequency standard which, in addition to the above structure of the first aspect, comprises:

FM noise of light suppressing means for detecting an FM noise of light contained in the laser beam emitted from the laser means and feeding back a control signal to cancel out the detected FM noise of light to the laser means.

According to the third aspect of the present invention, there is provided a laser pumped atomic frequency standard comprising:

an optical-microwave double resonance section for simultaneously irradiating a pumping laser beam and a modulated-microwave to a specific atom gas to cause a microwave double resonance;

control means for subjecting a pumping light intensity signal passing the optical microwave double resonance section to a phase sensitive detection and controlling a frequency of a microwave so as to make an output of the output signal from the phase sensitive detection means zero;

sweep means for sweeping a frequency of the modulated microwave to be applied to the optical microwave double resonance section; and means for integrating the output signal from the phase sensitive detection means during the sweeping by the sweep means and controlling the frequency of the pumping laser beam so as to make an integral value zero.

In this case, it is desirable to provide means for mutually switching between a circuit for feeding a sync detection output back to a microwave oscillator and a circuit for integrating the PSD output and feeding an integral output back to a laser.

According to the fourth aspect of the present invention, there is provided a laser pumped atomic frequency standard comprising:

an optical-microwave double resonance section for simultaneously irradiating a pumping laser beam and a modulated microwave to a specific atom gas to cause a microwave double resonance; and control means for subjecting a pumping light intensity signal passing the optical-microwave double resonance section to a phase sensitively detection and controlling a frequency of a microwave so as to make an output of the optical-microwave double resonance section zero, and the optical-microwave double resonance section being constituted by a specific atomic beam, a microwave and a laser beam which mutually cross in vacuum.

This optical-microwave double resonance section may be applied to a laser pumped atomic frequency standard which sweeps the frequency of the modulated microwave to be applied to the optical-microwave double resonance section, integrates a phase sensitive detection output resulting from the sweeping and controls the frequency of the pumping laser beam so as to make an integral value zero.

In this case, it is desirable to provide means for mutually switching between a circuit for feeding a sync detection output back to a microwave oscillator and a circuit for integrating the PSD output and feeding an integral output back to a laser.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a diagram showing the energy levels of a rubidium ($^{87}$Rb) atom;

FIGS. 5A and 5B are graphs exemplifying B and C spectrums;

FIG. 6 is a graph showing an example of a sync detection output;

FIG. 7 is a graph illustrating the light shift characteristic;

FIG. 10 is a graph showing the characteristic of an asymmetrical amount;

DETAILED DESCRIPTION OF THE PREFERRED EMBODIMENTS

Figure 1A:
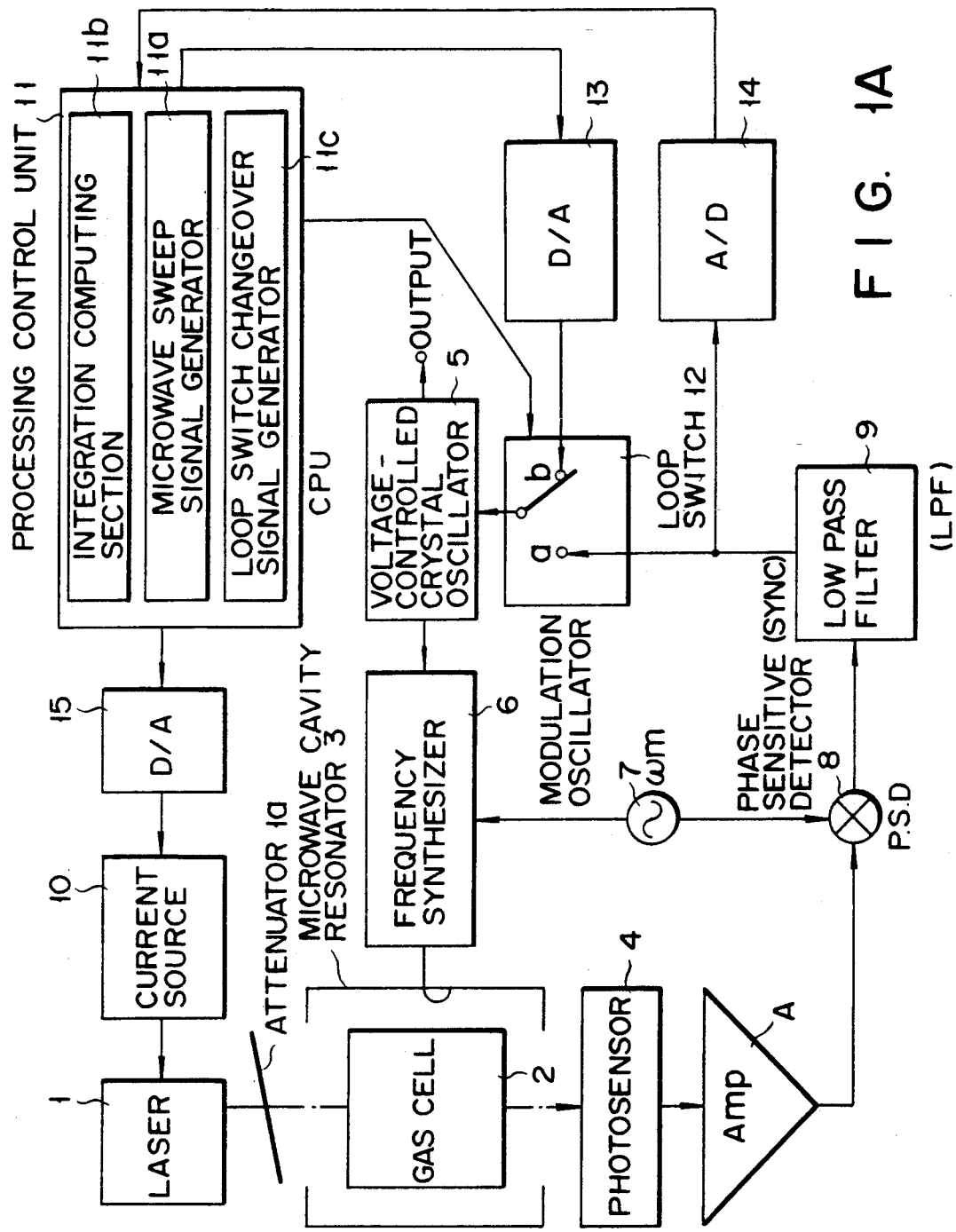
FIG. 1A is a block diagram illustrating the structure of essential portions of a laser pumped atomic frequency standard according to the first embodiment of the present invention.

Reference will now be made in detail to the presently preferred embodiments of this invention as illustrated in the accompanying drawings, in which like reference numerals or characters designate like or corresponding parts through the several drawings.

First, a description will be given of the principle of eliminating hindrance of the long-period frequency stabilization due to the optical shift by means of the atomic resonance frequency shift detection/compensation control technique which is the key feature in the atomic frequency standard of the present invention.

Figure 3:
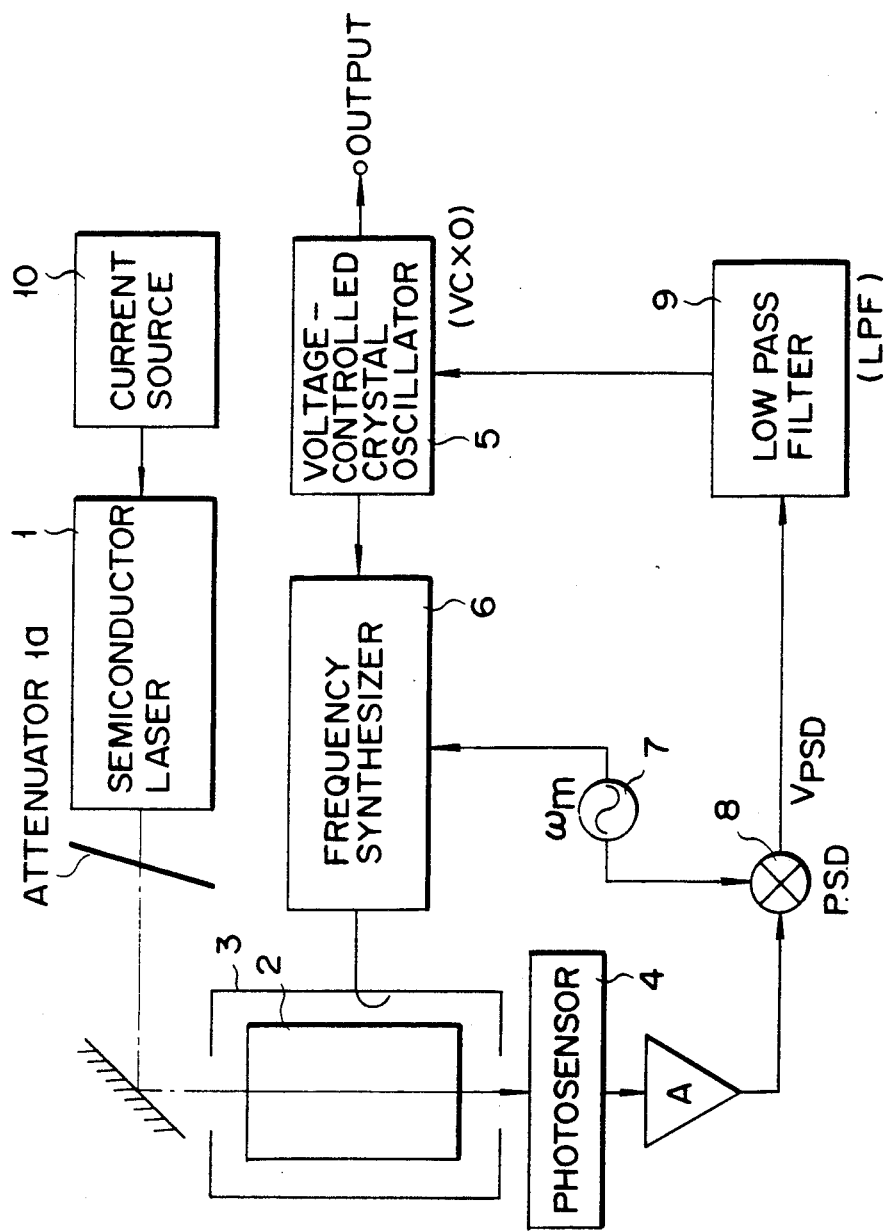
FIG. 3 is a block structural diagram of a conventional laser pumping rubidium atomic frequency standard.
Figure 8:
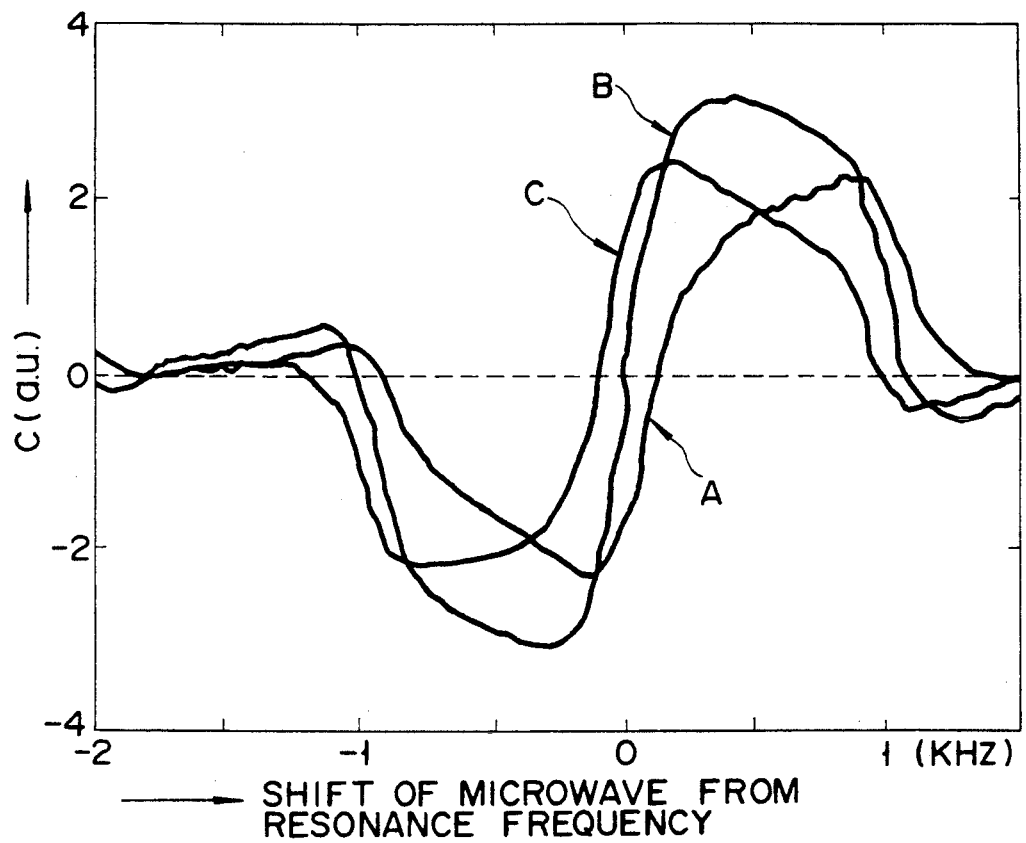
FIG. 8 is a graph exemplifying a deformation of a double resonance spectrum.

As described above, in the semiconductor laser pumped Rb atomic frequency standard as shown in FIG. 3, the microwave resonance frequency of $^{87}$Rb serving as the reference frequency is shifted as shown in FIG. 7 upon occurrence of a change in the frequency of the pumping light. At this time, the spectrum shown in FIGS. 5A and 5B also varies as illustrated in FIG. 8. It is theoretically and experimentally known that such a variation in PSD output based on the light shift considerably looses the symmetry.

Figure 9:
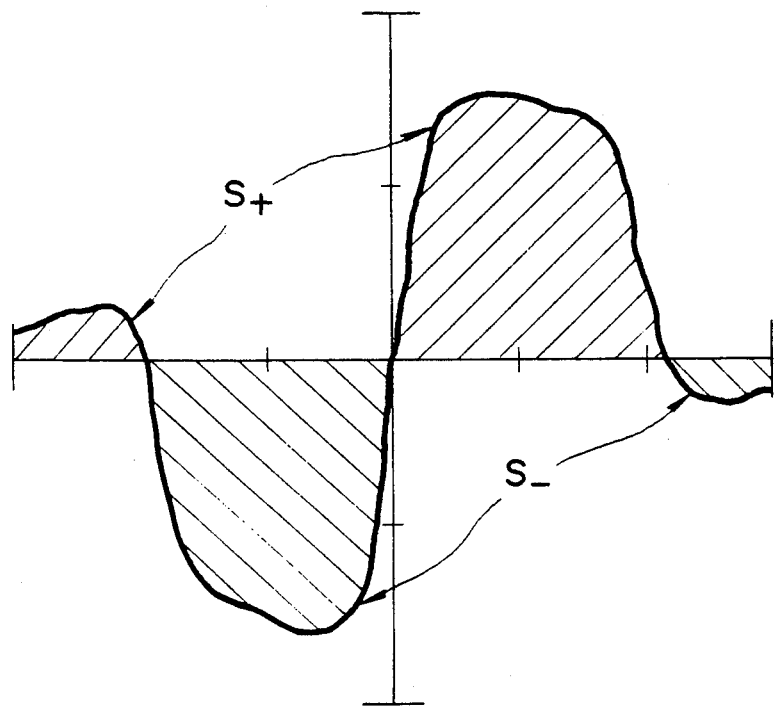
FIG. 9 is a diagram for explaining how to define an asymmetrical amount.

The quantity $\Delta S$ representing this asymmetry is defined as shown in FIG. 9. That is, this quantity is defined by the difference between the area of the upper half $S_+$ of the shape of the PSD output spectrum and the area of the lower half $S_-$ (although $\Delta S$ is defined by the difference between the areas of the C spectrum in FIG. 9, it should be apparent from the equation 1 that $\Delta S$ defined in terms of the B or C spectrum is substantially the same as $\Delta S$ defined in terms of the PSD output spectrum).

The dependency of this defined $\Delta S$ on a change in laser frequency is illustrated in FIG. 10 in which the curve A is for the laser power density of 1008 $\mu W/cm^2$, the curve B for 360 $\mu W/cm^2$ and the curve C for 144 $\mu W/cm^2$. As should be obvious from this figure, upon occurrence of a change in laser frequency from any laser power density, $\Delta S$ does not become zero. It should be apparent from FIG. 7, however, that controlling the laser frequency to set $\Delta S$ to zero can cancel out the shift of the microwave resonance frequency originated from the change in laser frequency.

FIG. 1A illustrates the block arrangement of the first embodiment of a semiconductor laser pumped atomic frequency standard of the present invention, designed on the basis of the above-described principle.

A brief description of FIG. 1A will be given below; like reference numerals are used in FIG. 1A to denote like or corresponding elements shown in FIG. 3. Furthermore, the gas cell of the resonance cell 2 may be sealed Cs gas substituting the Rb gas, but the following description will be described in case of the Rb gas sealed. Unlike in FIG. 3, the PSD output $V_{PSD}$ from the PSD 8 in FIG. 1a is not only supplied via an A/D converter 14 to a processing control unit 11, but also to the voltage-controlled crystal oscillator through the low-pass filter 9. The processing control unit 11, which comprises a CPU and peripheral circuits, is designed to alter the voltage that is applied to the oscillator 5 via a D/A converter 13 in order to sweep the frequency of the microwave to be applied to the microwave cavity resonator 3, forward and backward with the resonance frequency as the center, and to integrate $V_{PSD}$ input in accordance with the frequency sweeping. As this integral value corresponds to $\Delta S$ representing the aforementioned asymmetry, if the value is not zero, it is fed via a D/A converter 15 back to a current source 10 for driving the laser 1 so that the current flowing in the laser 1 is altered to make $\Delta S$ zero, thus stabilizing the laser oscillation frequency of the laser 1. Shift of the microwave resonance frequency is canceled out in this manner.

Referring to FIG. 1A, a loop switch 12 can alternately be set to its contacts a and b. When the switch 12 is switched to the contact a, the frequency standard functions as the conventional semiconductor laser pumped atomic frequency standard shown in FIG. 3 to provide short-period frequency stabilization. The switch 12 is mutually set to the contact b to open the loop for providing this short-period frequency stabilization, so that a self adjusting system is triggered to suppress frequency instability due to the light shift (long-period frequency instability) instead.

The structure shown in FIG. 1A will be described in detail below. Unlike the oscillator in FIG. 3, the oscillator in FIG. 1A is designed in such a way that the output $V_{PSD}$ of the PSD 8 is switched, by means of the loop switch 12 through the low-pass filter 9, between the control system applied the FM side band spectroscopy (on the side of the contact a), which has been explained in the description of the prior art, and the microwave resonance frequency shift compensating control system (on the contact b side) for compensating for a shift of the microwave resonance frequency caused by the laser frequency shift based on the above principle. This switching is executed by a signal from a loop switch changeover signal generator 11c in the processing control unit 11 which is included in the microwave resonance frequency shift compensation control system.

When the loop switch 12 is set to the contact b, i.e., to the microwave resonance frequency shift compensation control system, a voltage to be applied through the D/A converter 13 to the voltage-controlled crystal oscillator 5 is altered by a sweep signal from the signal generator 11a of the processing control unit 11, so that the frequency of the microwave to be applied to the microwave cavity resonator 3 is swept forward and backward around the resonance frequency. The output $V_{PSD}$ of the PSD 8 which varies by this sweeping is supplied through the A/D converter 14 to an integration computing section 11b in the processing control unit 11 where it is integrated. As this integral value corresponds to $\Delta S$ representing the aforementioned asymmetry, if the value is not zero, the processing control unit 11 outputs such a computation result as to make $\Delta S$ zero and feeds it via the D/A converter 15 back to the current source 10 to adjust the laser frequency, thereby compensating for a shift of the microwave resonance frequency due to the shifting of the laser frequency. When the sequence of the sweeping/integration operations is completed, the loop switch 12 is switched to the contact a, i.e., the normal control system as explained in the description of the prior art, by a changeover signal from the loop switch changeover signal generator 11c.

Periodic compensation for a shift of the microwave resonance frequency due to the laser frequency can realize a laser pumping rubidium atomic oscillator which suppresses a long-period variation in microwave frequency.

Figure 11:
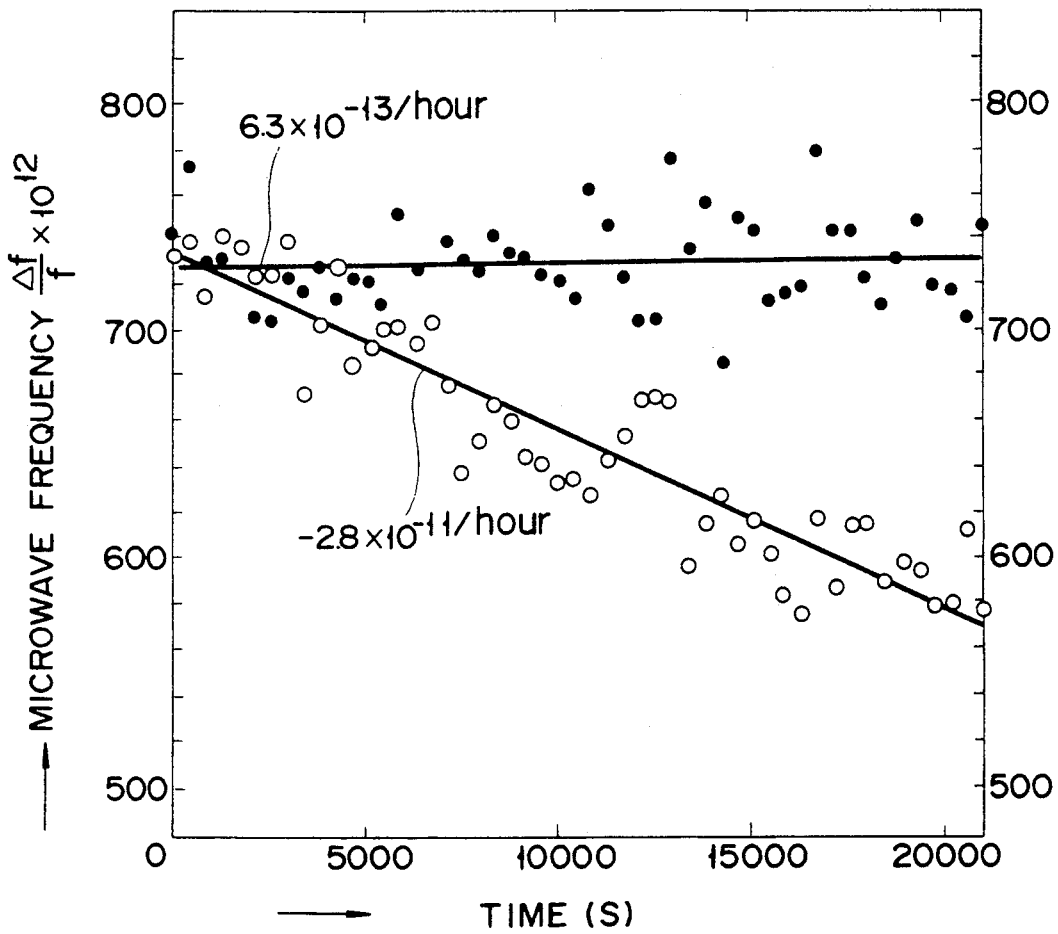
FIG. 11 is a graph illustrating the long-period stabilization of a microwave frequency.

FIG. 11 illustrates the long-period stabilization of a microwave frequency in a case where the switch 12 is periodically set to the contact b (see     : the switching was done for every 420 seconds and measuring $\Delta S$ required 120 seconds) and a case where the PSD output $V_{PSD}$ is continuously fed back to the voltage-controlled crystal oscillator 5 without switching the switch 12 as per the prior art (see o). In this case, the intensity of the laser beam is fixed to 1008 μW/cm². One graduation on the vertical scale is 0.14 Hz in terms of fluctuation of the microwave resonance frequency (6.8 GHz). It should be apparent from this figure that the amount of drifting is $-2.8 \times 10^{-11}$ /hour with no self adjustment done, whereas it is reduced to $6.3 \times 10^{-13}$ /hour, i.e., 1/40 of the former value, by self adjustment. It should be noted that the aforementioned time for measuring $\Delta S$ is just one example and may be much shortened.

According to the above embodiment of the present invention, the frequency of the phase-modulated microwave to be applied to the optical-microwave double resonance section is swept, a PSD output resulting from the sweeping is integrated and the frequency of the laser beam is so controlled as to make the integral value zero, whereby the shift of the microwave resonance frequency due to a change in the frequency of the pumping light in the laser pumped atomic frequency standard can be canceled out.

Figure 1B:
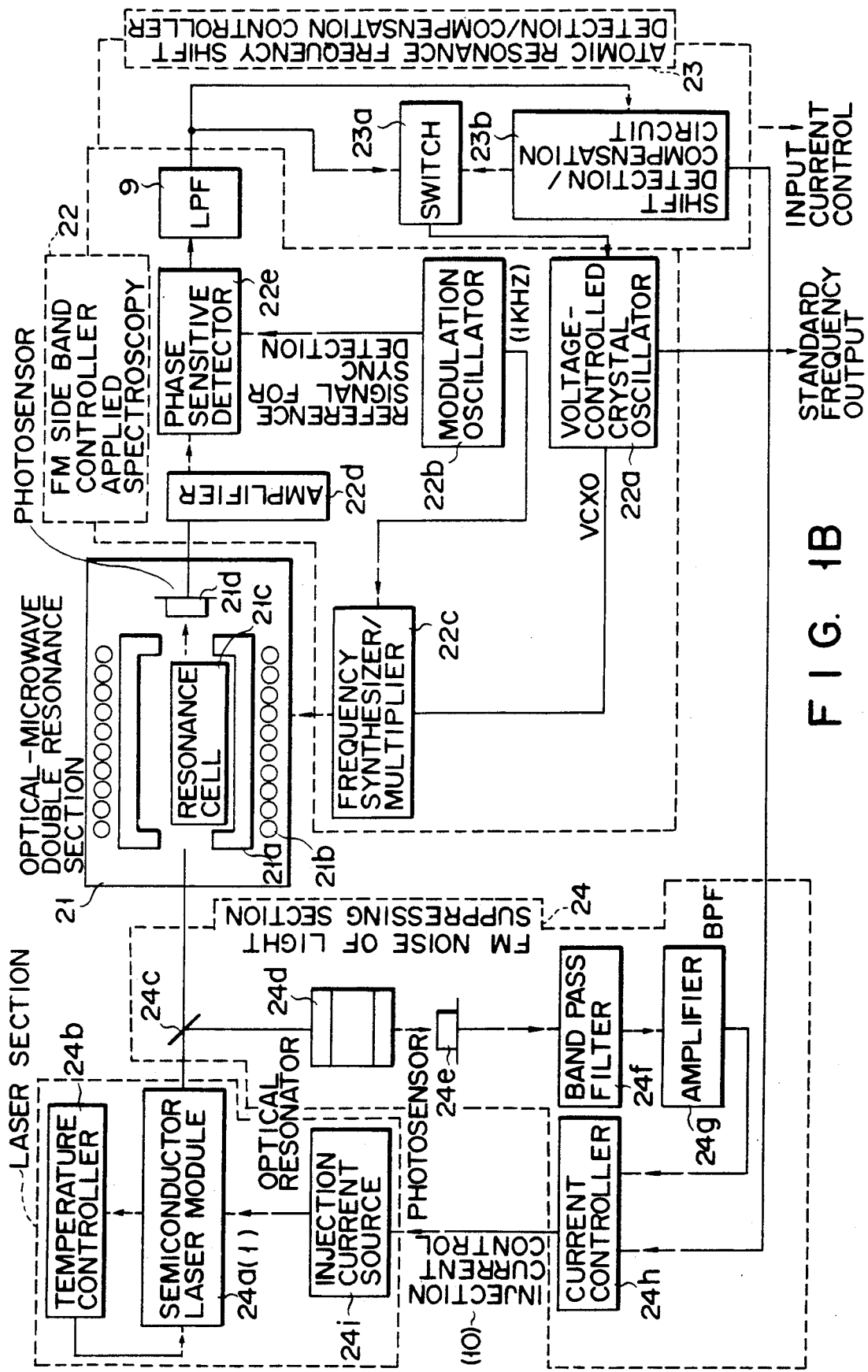
FIG. 1B is a block diagram illustrating the structure of essential portions of a laser pumped atomic frequency standard according to the second embodiment of the present invention.

FIG. 1B is a block diagram illustrating the structure of essential portions of an atomic frequency standard according to the second embodiment.

Referring to FIG. 1B, an optical-microwave double resonance section 21 comprises a cavity resonator 21a, a coil 21b (omitted in FIGS. 1A and 3) for producing a magnetic field in this cavity resonator 21a, a $^{87}$Rb or a $^{113}$Cs resonance cell 21c provided in the cavity resonator 21a, and a photosensor 21d for detecting light from the cavity resonator.

A controller 22 applied FM side band spectroscopy comprises a voltage-controlled crystal oscillator (VCXO) 22a, a modulation oscillator 22b, a frequency synthesizer/multiplier 22c, an amplifier 22d and a phase detector 22e. The frequency synthesizer/multiplier 22c applies a microwave output of a predetermined frequency, which is obtained by modulating the output of the VCXO 22a with a modulation wave from the modulation oscillator 22b, to the optical-microwave double resonance section 21. The PSD 22e detects the level and phase of a signal, supplied via the amplifier 22d from the photosensor 21d, using a reference signal from the modulation wave oscillator 22b.

An atomic resonance frequency shift detection/compensation controller 23 comprises a switch 23a and a shift detection/compensation circuit 23b. The switch 23a serves to feed the output of the PSD 22e via a low-pass filter (LPF) 9 back to the VCXO 22a to determine whether the controller 22 should be operated normally or the controller 23 should be operated. The circuit 23b periodically sends a select signal to the switch 23a. Further, when the switch 23a is set to the side to activate the controller 23, the circuit 23b latches the phase detection output coming through the LPF 9 to detect the amount of shift of the atomic resonance frequency, then supplies a compensation control signal corresponding to the detected amount of shift to a current controller (to be described later).

The controller 23 corresponds to the unit constituted by the processing control unit 11, loop switch 12, D/A converter 13, A/D converter 14 and D/A converter 15 of the first embodiment, and has a corresponding function.

An FM noise of light suppressing section 24 comprises a semiconductor laser module 24a, a temperature controller 24b, a half mirror 24c, an optical resonator 24d, a photosensor 24e, a band-pass filter (BPF) 24f, an amplifier 24g, a current controller 24h and an input current source 24i. The laser module 24a applies a laser beam to the microwave frequency double resonance section 21. The temperature controller controls the temperature of the laser module 24a. The optical resonator 24d receives the laser beam from the laser module 24a branched by the half mirror 24c and causes a predetermined optical resonance. The photosensor 24e performs photoelectric conversion of the output light of the optical resonator 24d. The BPF 24f passes only a predetermined band component corresponding to the output frequency of the modulation oscillator 22b from the output signal of the photosensor 24e and supplies it to the amplifier 24g. The current controller 24h is controlled by the output of the amplifier 24g and the compensation control signal from the shift detection/compensation circuit 23b. The input current source 24i receives the output of the current controller 24h as an input current control signal and generates an input current to the semiconductor laser module 24a.

According to the thus constituted second embodiment, the functions of the optical-microwave double resonance section 21, FM side band spectrum applied controller 22 and atomic resonance frequency shift detection/compensation controller 23 correspond to those of the corresponding sections in the first embodiment, so that only the operation of the FM noise of light suppressing section 24 will be given below.

As described earlier, the FM noise of light suppressing section 24 has a function to prevent the short-period frequency stabilization of the final signal from the voltage-controlled crystal oscillator 22a from being hindered by FM noise of light generated by the laser section itself.

In other words, the this section 24 forms a negative feedback loop with respect to the laser beam emitted from the semiconductor laser module 24a, so that the input current suppressing an FM noise of light detected by the optical resonator 24d and filtered by the BPF 24f is supplied via the current controller 24h to the laser module 24a from the injection current source 24i.

The long-period stabilization of the output microwave frequency can be secured in addition to the short-period stabilization in the above manner. To further improve the performance to realize a new primary frequency standard, it is necessary to improve the frequency accuracy or eliminate a frequency shift caused by collision of $^{87}$Rb gas or $^{113}$Cs gas and buffer gas in the gas cell.

Figure 2:
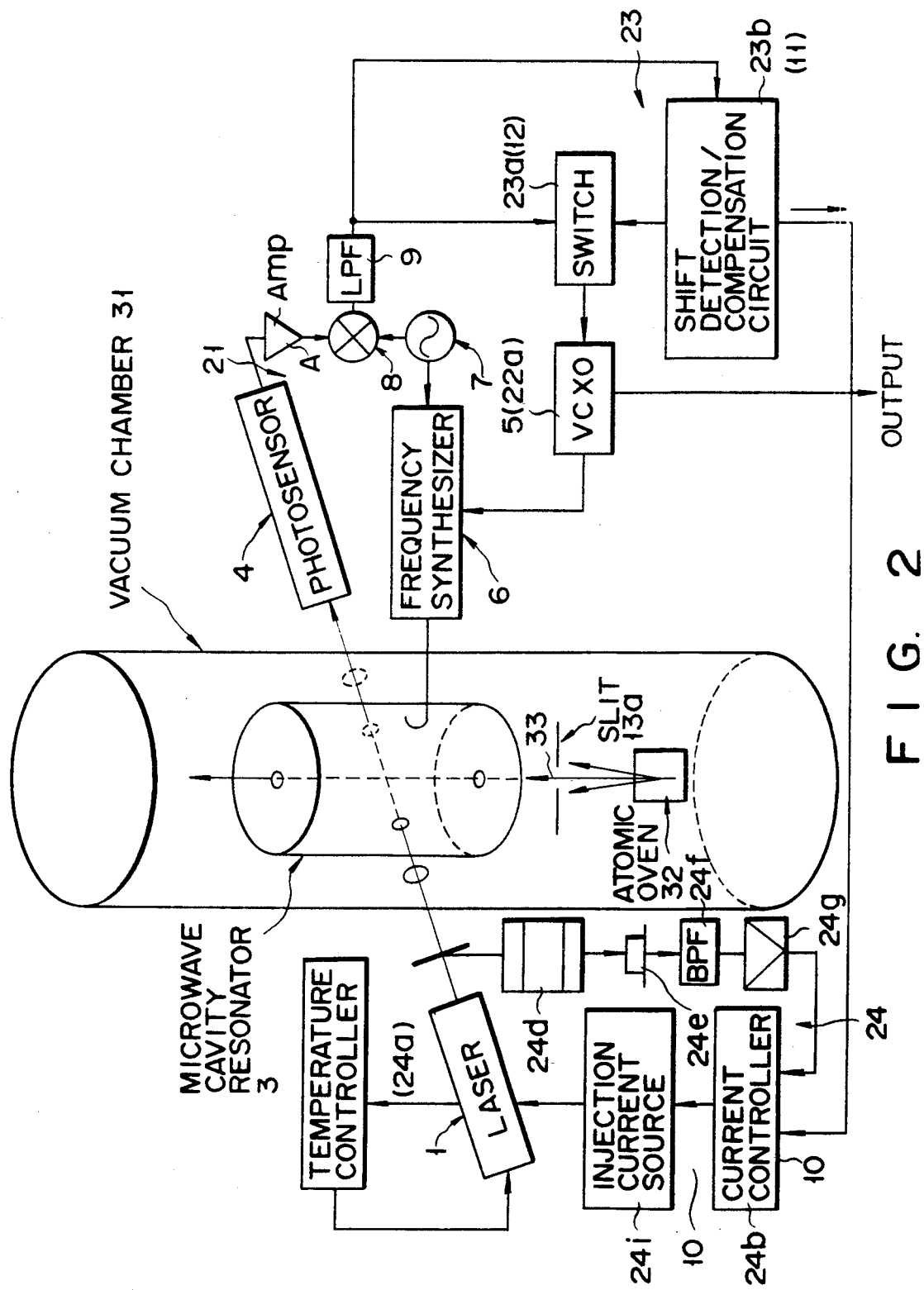
FIG. 2 is a block diagram illustrating the structure of essential portions of a laser pumping atomic frequency standard according to the third embodiment of the present invention.

This can be realized by an optical-microwave double resonance section according to the third embodiment shown in FIG. 2. As illustrated, the gas cell of the resonance cell 2 (21c in FIG. 1B) in FIG. 1A or 1B having a rubidium or cesium gas sealed therein is replaced with an atomic oven 32 to generate an atomic beam 33 such as a rubidium ($^{87}$Rb) or a cesium ($^{113}$Cs) in a vacuum chamber 31 and this atomic beam 33 is guided through a slit 13a to the microwave cavity resonator 3. The microwave from the frequency synthesizer 6 is rendered to cross the atomic beam 33. The laser 1 is arranged to hit a laser beam 17 to that portion where the atomic beam 33 crosses the microwave, from the direction crossing the atomic beam 33 and the microwave. The other structure is the same as the one shown in FIG. 1A or 1B. With the arrangement, the Doppler broadening of the atomic microwave spectrum can be reduced without using the buffer gas and the frequency shift due to the collision between the $^{87}$Rb gas or $^{133}$Cs gas and buffer gas can be eliminated. Perpendicularly crossing the rubidium beam 33 and the microwave, the Doppler broadening becomes zero. The microwave may be a progressive wave or stationary wave.

According to the above embodiment, the optical-microwave double resonance section is constituted by a rubidium beam or a cesium beam, a microwave and a laser beam which mutually cross in vacuum, so that the frequency shift caused by collision between the rubidium or cesium gas and buffer gas in a conventional atomic frequency standard can be eliminated, thus improving the frequency accuracy of the laser pumped atomic frequency standard.

Figure 12:
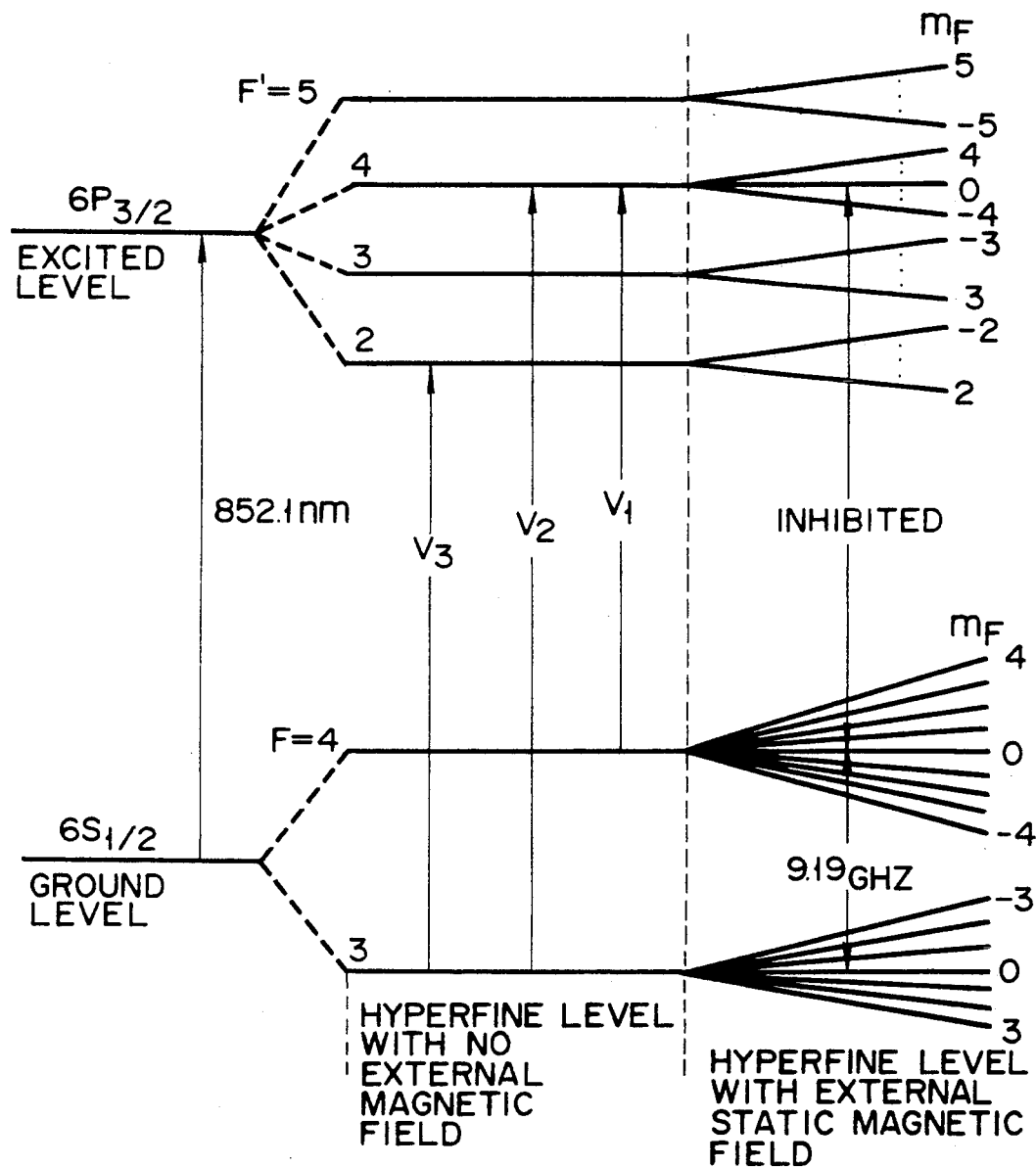
FIG. 12 is a diagram showing the energy levels of a cesium ($^{133}$Cs) atom.

FIG. 12 shows atomic transition based on the energy level of the cesium atom ($^{133}$Cs) which may be used to substitute $^{87}$Rb.

As described above, the present invention employs the atomic resonance frequency shift detection/compensation controller which sweeps the frequency of the modulated microwave to be applied to the optical-microwave double resonance section, integrates a PSD output resulting from the sweeping and controls the frequency of the laser beam so as to make the integral value zero, whereby the shift of the microwave resonance frequency due to a change in the frequency of the pumping light (or light shift) in the laser pumped atomic frequency standard can be canceled out, thus ensuring a long-period stabilization of the output microwave frequency.

Further, according to the present invention, the optical-microwave double resonance section is constituted by an atomic beam, a microwave and a laser beam which mutually cross in vacuum, so that the frequency shift caused by collision between the rubidium or cesium gas and buffer gas in a conventional atomic frequency standard, can be eliminated, thus improving the frequency accuracy of the laser pumped atomic frequency standard.

In addition, according to the present invention, additional provision of the FM noise of light suppressing section in the laser section can prevent the short-period frequency stabilization from being hindered by FM noise generated by the laser section.

Additional embodiments of the present invention will be apparent to those skilled in the art from consideration of the specification and practice of the present invention disclosed herein. It is intended that the specification and examples be considered just as exemplary, with the true scope of the present invention being indicated by the following claims.

What is claimed is:

1. An atomic frequency standard comprising:
   a double resonance section for causing a double resonance between light and a microwave with respect to a specific atom;
   laser means for emitting a laser beam with a predetermined frequency, serving as pumping light, to said double resonance section;
   voltage-controlled oscillator means for oscillating a predetermined frequency signal that is the origin of said microwave;
   low frequency signal oscillator means for generating a modulation signal and a low frequency signal to be a reference signal;
   microwave generator means for generating a microwave acquired by subjecting said predetermined frequency signal to multiplication and at least one phase and frequency modulation in accordance with said predetermined frequency signal from said voltage-controlled oscillator means and said modulation signal from said low frequency generator means, and applying said microwave to said double resonance section;
   photosensor means for detecting a component of said laser beam modulated by said double resonance section;
   phase sensitive detector means for detecting a level and phase of an output signal of said photosensor means with said reference signal from said low frequency signal oscillator means;
   sweep signal generator means for generating a sweep signal for sweeping the frequency of said microwave;
   switching means, having first and second nodes to be mutually switched from one mode to the other, for feeding an output signal from said phase sensitive detector means back to said voltage-controlled oscillator means when switched to said first node, and supplying said sweep signal from said sweep signal generator means to said voltage-controlled oscillator means to permit substantial sweeping of the frequency of said microwave emitted from said microwave generator means when switched to said second node; and
   shift detection/compensation means, which operates in a state where said switching means is set to said second node, for detecting a light shift variation which is produced when the microwave and the laser beam are simultaneously irradiated onto the same specific atom and an electric field of the laser beam causes a shift in a resonance frequency of transient energy level which serves as a standard of the frequency of the microwave and which is dependent on both the frequency and power of the light beam, thereby to substantially detect an amount of shift of a microwave resonance frequency in said double resonance section in accordance with the output signal from said phase sensitive detector means, and for compensating for the light shift variation, thereby feeding a laser frequency compensation signal to cancel out said detected amount of shift back to said laser means, wherein a self adjusting system of said atomic frequency standard is triggered to suppress long-period frequency instability due to the light shift.

2. The standard according to claim 1, wherein said shift detection/compensation means includes integral computing means for integrating the output signal from said phase sensitive detector means obtained by sweeping the frequency of said microwave and computing an asymmetrical amount of positive and negative areas of said integrated signal in order to detect an amount of shift of said microwave resonance frequency, and said integral computing means outputs, as said laser frequency compensation signal, such a computation result as to make said asymmetrical amount to zero.

3. The standard according to claim 1, wherein said double resonance section includes a microwave cavity resonator and a gas cell disposed in said microwave cavity resonator and having a rubidium gas as said specific atom sealed therein.

4. The standard according to claim 1, wherein said double resonance section includes a microwave cavity resonator and means, provided in said microwave cavity resonator, for emitting a rubidium beam as said specific atom.

5. The standard according to claim 1, wherein said double resonance section includes a microwave cavity resonator and means, provided in said microwave cavity resonator, for using a cesium gas as said specific atom.

6. The standard according to claim 1, wherein said double resonance section includes a microwave cavity resonator and means, provided in said microwave cavity resonator, for emitting a cesium beam as said specific atom.

7. An atomic frequency standard comprising:
   a double resonance section for causing a double resonance between light and a microwave with respect to a specific atom;
   laser means for emitting a laser beam with a predetermined frequency, serving as pumping light, to said double resonance section;
   voltage-controlled oscillator means for oscillating a predetermined frequency signal that is the origin of said microwave;
   low frequency signal oscillator means for generating a modulation signal and a low frequency signal to be a reference signal;
   microwave generator means for generating a microwave acquired by subjecting said predetermined frequency signal to multiplication and phase modulation in accordance with said predetermined frequency signal from said voltage-controlled oscillator means and said modulation signal from said low frequency generator means, and applying said microwave to said double resonance section;
   photosensor means for detecting a component of said laser beam modulating by said double resonance section;
   phase sensitive detector means for detecting a level and phase of an output signal of said photosensor means with said reference signal from said low frequency signal oscillator means;
   sweep signal generator means for generating a sweep signal for sweeping the frequency of said microwave;
   switching means, having first and second nodes to be mutually switched from one to the other, for feeding an output signal from said phase sensitive detector means back to said voltage-controlled oscillator means when switched to said first node, and supplying said sweep signal from said sweep signal generator means to said voltage-controlled oscillator means to permit substantial sweeping of the frequency of said microwave emitted from said microwave generator means when switched to said second node;
   shift detection/compensation means for substantially detecting an amount of shift of a microwave resonance frequency in said double resonance section in accordance with the output signal from said phase sensitive detector means and feeding a laser frequency compensation signal to cancel out said detected amount of shift back to said laser means, in a state where said switching means is set to said second node; and
   FM noise of light suppressing means for detecting an FM noise of light contained in said laser beam emitted from said laser means and feeding back a control signal to cancel out said detected FM noise of light to said laser means.

8. The standard according to claim 7, wherein said shift detection/compensation means includes integral computing means for integrating the output signal from said phase sensitive detector means obtained by sweeping the frequency of said microwave and computing an asymmetrical amount of positive and negative areas of said integrated signal in order to detect an amount of shift of said microwave resonance frequency, and said integral computing means outputs, as said laser frequency compensation signal, such a computation result as to make said asymmetrical amount to zero.

9. The standard according to claim 7, wherein said double resonance section includes a microwave cavity resonator and a gas cell disposed in said microwave cavity resonator and having a rubidium gas as said predetermined atom sealed therein.

10. The standard according to claim 7, wherein said double resonance section includes a microwave cavity resonator and means, provided in said microwave cavity resonator, for emitting a rubidium beam as said predetermined atom.

11. The standard according to claim 7, wherein said double resonance section includes a microwave cavity resonator and means, provided in said microwave cavity resonator, for using a cesium gas as said predetermined atom.

12. The standard according to claim 7, wherein said double resonance section includes a microwave cavity resonator and means, provided in said microwave cavity resonator, for emitting a cesium beam as said specific atom.

13. The standard according to claim 7, wherein said FM noise suppressing means comprises:
   branching means for branching said laser beam from said laser means;
   optical resonance means for causing optical resonance upon reception of said laser beam branched by said branching means;
   photosensor means for detecting output light of said optical resonance means; and
   band limiting means for feedbacking a signal within a frequency band corresponding to an output frequency of said low frequency signal oscillator means from an output signal of said photosensor means.

14. A laser pumped atomic frequency standard comprising:
   an optical-microwave double resonance section for simultaneously irradiating a pumping laser beam and a modulated microwave to a specific atom gas to cause an optical-microwave double resonance;
   control means for subjecting a pumping light intensity signal passing said optical-microwave double resonance section to a phase sensitive detection and controlling a frequency of a microwave so as to make an output of the phase sensitive detection zero;
   sweep means for sweeping a frequency of said phase-modulated microwave to be applied to said optical-microwave double resonance section; and
   means for integrating the output of the phase sensitive detection resulting from the sweeping and controlling a frequency of said pumping laser beam so as to make an integral value zero.

15. The standard according to claim 14, further comprising means for mutually switching between a circuit for feeding the output of said phase sensitive detection back to a microwave oscillator and a circuit for integrating the output of the phase sensitive detection and feeding an integral output back to a laser.

16. A laser pumped atomic frequency standard comprising:

an optical-microwave double resonance section for simultaneously irradiating a pumping laser beam and a modulated microwave to a specific atom gas to cause a microwave double resonance; and control means for subjecting a pumping light intensity signal passing said optical-microwave double resonance section to a phase sensitive detection and controlling a frequency of a microwave so as to make an output of the phase sensitive detection zero; and said optical-microwave double resonance section being constituted by a specific atomic beam, a microwave and a laser beam which mutually cross in vacuum.

17. The standard according to claim 16, wherein said standard further comprises:

means for sweeping a frequency of said modulated microwave to be applied to said optical-microwave double resonance section; and means for integrating the output of the phase sensitive detection resulting from the sweeping by said sweeping means and controlling a frequency of said pumping laser beam so as to make an integral value zero.

18. The standard according to claim 17, further comprising means for mutually switching between a circuit for feeding output of the phase sensitive detection back to a microwave oscillator and a circuit for the output of the phase sensitive detection and feeding an integral output back to a laser.

* * * * *